US007167376B2

(12) United States Patent
Miyashita et al.

(10) Patent No.: US 7,167,376 B2
(45) Date of Patent: Jan. 23, 2007

(54) MULTILAYER WIRING BOARD, METHOD OF MOUNTING COMPONENTS, AND IMAGE PICK-UP DEVICE

(75) Inventors: Mamoru Miyashita, Saitama (JP); Hiroki Ohta, Saitama (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 247 days.

(21) Appl. No.: 10/845,570

(22) Filed: May 14, 2004

(65) Prior Publication Data

US 2004/0233650 A1 Nov. 25, 2004

(30) Foreign Application Priority Data

May 19, 2003 (JP) ............................. 2003-140653
Jan. 30, 2004 (JP) ............................. 2004-022439

(51) Int. Cl.
*H01L 31/203* (2006.01)
*H01L 31/232* (2006.01)

(52) U.S. Cl. ...................... 361/761; 361/764; 361/783; 257/432; 257/434; 257/700; 438/64; 438/65; 438/116

(58) Field of Classification Search ..................... None
See application file for complete search history.

(56) References Cited

U.S. PATENT DOCUMENTS 5,200,631 A * 4/1993 Austin et al. ............... 257/570
5,652,462 A 7/1997 Matsunaga et al.
5,763,943 A * 6/1998 Baker et al. ................ 257/686
5,901,046 A * 5/1999 Ohta et al. .................. 361/760
6,384,473 B1 * 5/2002 Peterson et al. ............ 257/680
6,459,161 B1 10/2002 Hirata et al.
2002/0096753 A1 * 7/2002 Tu et al. ..................... 257/680

* cited by examiner

*Primary Examiner*—John B. Vigushin
(74) *Attorney, Agent, or Firm*—Sughrue Mion, PLLC

(57) ABSTRACT

A multilayer wiring board on which multiple components are overlappingly mounted. The multilayer wiring board includes: a first surface on which a first component among the multiple components is mounted; and a second surface whose height in a thickness direction of the multilayer wiring board is smaller than that of the first surface, by which a step is provided between the first surface and the second surface, a second component among the multiple components being mounted on the second surface to partially overlap the first component in a non-contact manner, the second surface also having a light-transmitting window through which light is transmitted.

20 Claims, 11 Drawing Sheets

13
14
60
46
60
50
49
40
44
56
42
28A
28
52A
48
52
54
52A
54A
57

LENS UNIT
DRIVER CIRCUIT
CPU
LCD
CCD
CONTROL SECTION
COMMUNICATION INTERFACE
SHUTTER RELEASE BUTTON
INTEGRAL MEMORY
MEDIA INTERFACE
EXTERNAL MEDIA
14
28
36
26
24
52
20
34
16
32
30
31

40
56
57
60
54A
14
52A
54
13
52
48
49
52A
28
46
28A
60
50
44
42

56
57
61
60
66
54A
14
64
52A
13
48
54
53
52
52A
49
D1
68
28
28A
70
D2
72
60
62A
62B
62C
62D
62E
62F
62G
62H
62I
62α
62β
62γ

MULTILAYER WIRING BOARD, METHOD OF MOUNTING COMPONENTS, AND IMAGE PICK-UP DEVICE

CROSS-REFERENCE TO RELATED APPLICATION

This application claims priority under 35 USC 119 from Japanese Patent Application Nos. 2003-140653 and 2004-22439, the disclosure of which is incorporated by reference herein.

BACKGROUND OF THE INVENTION

1. Field of the Invention

The present invention relates to a multilayer wiring board, a method of mounting components, and an image pick-up device. More particularly, the present invention relates to a multilayer wiring board on which multiple components are overlappingly mounted, a method of mounting components on the multilayer wiring board, and an image pick-up device provided with the multilayer wiring board.

2. Description of the Related Art

Conventionally, in mounting components such as integrated circuits on a board, the components are often mounted overlappingly in several layers so that multiple components can be mounted on a limited surface area of the board (see for example Japanese Patent Application Laid-Open (JP-A) Nos. 2000-150699 and 6-342875). However, as also taught in these publications, such a conventional mounting method requires connecting terminals of components overlapping other components to the board by wires or the like, which may cause a problem due to noise on the wires.

SUMMARY OF THE INVENTION

The present invention was developed in light of the aforementioned circumstances, and provides a multilayer wiring board on which multiple components are overlappingly mounted with suppressed influence of noise, a method of mounting components on the multilayer wiring board, and an image pick-up device provided with the multilayer wiring board.

In order to solve the problem described above, a first aspect of the present invention is a multilayer wiring board on which multiple components are overlappingly mounted, the multilayer wiring board including: a first surface on which a first component among the multiple components is mounted; and a second surface whose height in a thickness direction of the multilayer wiring board is smaller than that of the first surface, by which a step is provided between the first surface and the second surface, a second component among the multiple components being mounted on the second surface to partially overlap the first component in a non-contact manner, the second surface also having a light-transmitting window through which light is transmitted.

In this structure, the height of the second surface in the thickness direction of the multilayer wiring board is smaller than that of the first surface, by which a step is provided between the first surface and the second surface. The second surface has a light-transmitting window through which light is transmitted. In mounting the first and the second components overlappingly on the multilayer wiring board utilizing the step, the second component may be mounted on the second surface and the first component may be mounted directly on the first surface in a non-contact manner with the second component, i.e., without being electrically connected to the second component by wires or the like, obviating influence of noise on wires which might otherwise be required. Further, when a component which requires light-receiving, such as an image sensor, is mounted on the second surface, a light-transmitting window formed in the second surface allows light to reach a light-receiving surface of the component.

The total thickness of the multilayer wiring board including components mounted thereon can be reduced even after the first and the second components are mounted. Further, since the multiple components are overlappingly mounted on the multilayer wiring board, the wiring board can be reduced in size, compared to cases where multiple components are juxtaposed to one another.

Note that "mounted on the first surface (or the second surface)" herein refers to "mounted on the first surface (or the second surface) and electrically connected thereto."

A second aspect of the present invention is a multilayer wiring board which includes: a first stack with a light-transmitting window formed therein through which light is transmitted; and a second stack with an opening formed therein at a position at which light transmitted through the light-transmitting window can be transmitted through the opening, the second stack being disposed over the first stack, by which a step is provided between the first stack and the second stack.

In this structure, the light-transmitting window and the opening provide a step between the first stack and the second stack, and at least one of facing surfaces thereof is exposed. With this structure, a component may be disposed on the exposed surface and another component may be disposed, utilizing the step, on the surface outside the step to partially overlap the component disposed on the exposed surface. Accordingly, the same effects as those of the first aspect can be obtained.

Each of the first and the second stack may be formed by stacking a a plurality of boards, or by a single board.

A third aspect of the present invention is an image pick-up device including a multilayer wiring board on which multiple components are overlappingly mounted, the image pick-up device including: a multilayer wiring board which includes a first surface on which at least one component among the multiple components is mounted and a second surface whose height in a thickness direction of the multilayer wiring board is smaller than that of the first surface, by which a step is provided between the first surface and the second surface, the second surface having a light-transmitting window through which light is transmitted; an image sensor mounted on the second surface to receive light transmitted through the light-transmitting window; a first component mounted on the first surface partially overlapping the image sensor in a non-contact manner; and a lens unit disposed at a position at which light from a subject transmitted through the light-transmitting window can be focused on a light-receiving surface of the image sensor.

The multilayer wiring board on which multiple components are overlappingly mounted is applied to the image pick-up device of the present aspect. The multilayer wiring board has the first and second surfaces with a step formed therebetween, and the light-transmitting window through which light is transmitted. The image sensor is mounted on the second surface of the multilayer wiring board to receive, at the light-receiving surface thereof, the light transmitted through the light-transmitting window. That is, the light-receiving surface of the image sensor covers the light-transmitting window. The first component is mounted on the first surface to partially overlap the image sensor in a non-contact manner. The lens unit is disposed at a position at which the light from a subject transmitted through the light-transmitting window is allowed to be focused on the light-receiving surface of the image sensor. That is, the lens unit is disposed at an opposite side of the multilayer wiring board from the image sensor, with the light-transmitting window of the multilayer wiring board interposed therebetween.

In accordance with this structure, the first component may be mounted on the first surface without requiring wires, obviating influence of noise on wires which might otherwise be required for mounting multiple components overlappingly on the multilayer wiring board. Further, the light-transmitting window formed in the second surface allows the light to reach the light-receiving surface of the image sensor.

Because the image sensor is mounted on the second surface, the distance between the lens unit and the image sensor can be reduced.

The total thickness of the multilayer wiring board including components mounted thereon can be reduced even after the first component, the image sensor and the lens unit are mounted. Further, since the multiple components are overlappingly mounted on the multilayer wiring board, the wiring board can be reduced in size, compared to cases where multiple components are juxtaposed to one another.

A fourth aspect of the present invention is an image pick-up device which includes: a multilayer wiring board including a first stack with a light-transmitting window formed therein through which light is transmitted, and a second stack with an opening formed therein at a position at which the opening at least partially overlaps the light-transmitting window, the second stack being disposed over the first stack, by which a step is provided between the first stack and the second stack; an image sensor mounted on the first stack or on the second stack to receive light transmitted through the light-transmitting window and the opening; and a lens unit disposed at a position at which light from a subject transmitted through the light-transmitting window can be focused on a light-receiving surface of the image sensor.

The multilayer wiring board is applied to the image pick-up device of the present aspect. The image sensor is mounted on the first stack or the second stack of the multilayer wiring board to receive the light passing through the light-transmitting window and the opening. The lens unit is disposed at the position at which the light from the subject passing through the light-transmitting window is allowed to be focused on the light-receiving surface of the image sensor. That is, the lens unit is disposed at an opposite side of the multilayer wiring board from the image sensor, with the light-transmitting window of the multilayer wiring board interposed therebetween.

In accordance with this structure, other components may be mounted over the image sensor without requiring wires or the like, obviating influence of noise on wires which might otherwise be required for mounting multiple components overlappingly on the multilayer wiring board. Further, the light-transmitting window and the opening respectively formed in the first stack and the second stack allow the light to reach the light-receiving surface of the image sensor.

The total thickness of the multilayer wiring board including components mounted thereon can be reduced even after the components, the image sensor and the lens unit are mounted. Further, since the multiple components are overlappingly mounted on the multilayer wiring board, the wiring board can be reduced in size, compared to cases where multiple components are juxtaposed to one another.

A fifth aspect of the present invention is a method of overlappingly mounting multiple components on a multilayer wiring board, the method including: mounting an image sensor on a second surface of a multilayer wiring board to receive light coming in through the light-transmitting window, the multilayer wiring board including a first surface on which at least one component among the multiple components is mounted, and a second surface whose height in a thickness direction of the multilayer wiring board is smaller than that of the first surface, by which a step is provided between the first surface and the second surface, the second surface having a light-transmitting window through which light is transmitted; and mounting a first component on the first surface at a position at which the first component partially overlaps the image sensor in a non-contact manner.

The foregoing method is directed to overlappingly mounting multiple components on the multilayer wiring board. The multilayer wiring board includes a first surface on which at least one component among the multiple components is mounted and a second surface whose height in a thickness direction of the multilayer wiring board is smaller than that of the first surface, by which a step is provided between the first surface and the second surface, the second surface having a light-transmitting window through which light is transmitted. The image sensor and the first component are mounted on the multilayer wiring board. The mounting process is as follows. First, the image sensor is mounted on the second surface to receive light coming in through the light-transmitting window. Then the first component is mounted on the first surface to partially overlap the image sensor in a non-contact manner.

According to this process, it is easy to mount the image sensor and the first component in an overlapped manner.

BRIEF DESCRIPTION OF THE DRAWINGS

Preferred embodiments of the invention will be described in detail below with reference to the accompanying drawings in which.

Figure 1:
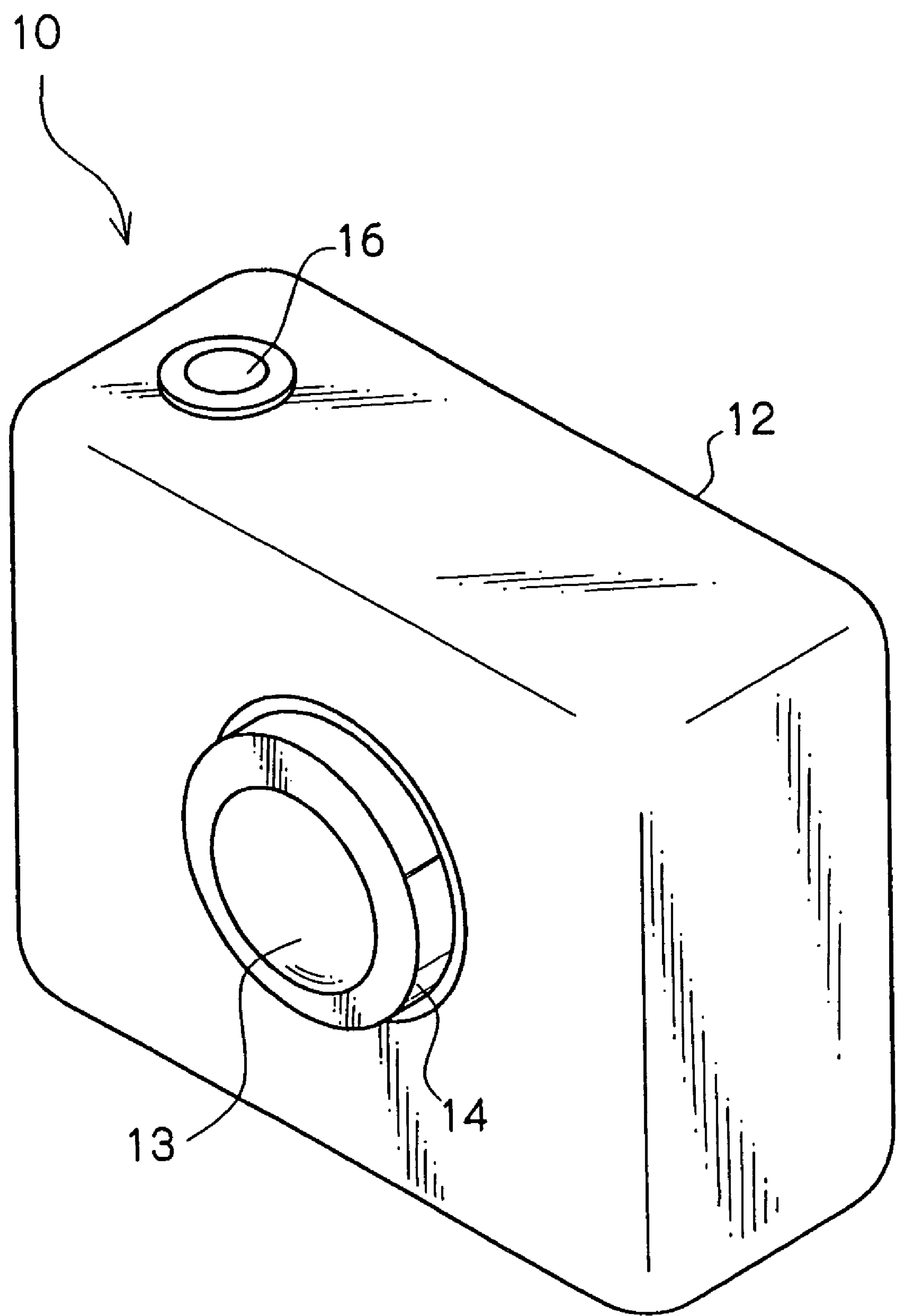
FIG. 1 is a perspective view of a digital camera of a first embodiment.

DESCRIPTION OF THE PREFERRED EMBODIMENTS (First Embodiment)

Referring to the drawings, a first embodiment of the multilayer wiring board, the component mounting method and the image pick-up device will be described in detail. A digital camera is illustrated as an example of the image pick-up device in this embodiment.

Figure 2:
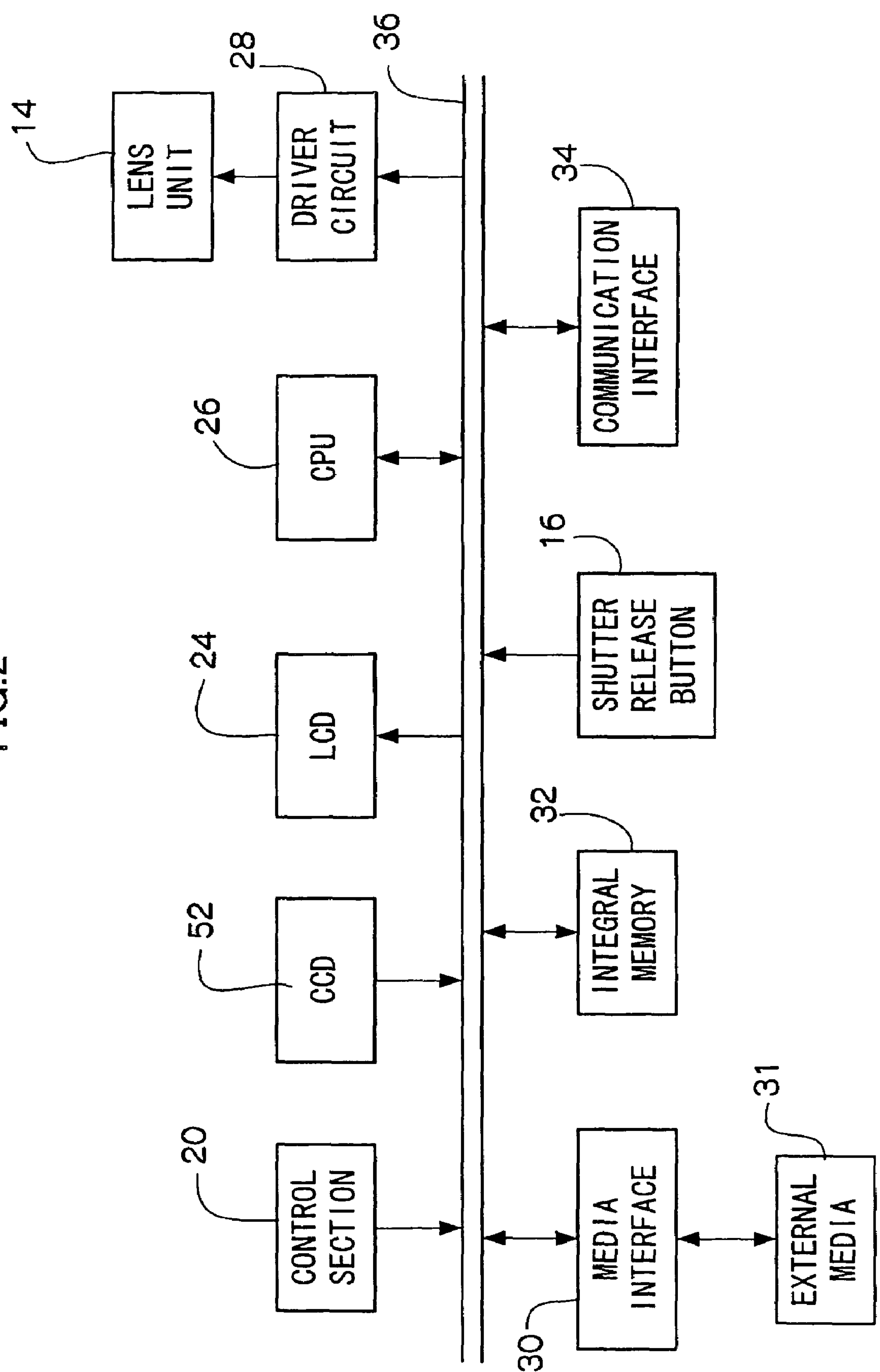
FIG. 2 is a schematic block diagram illustrating a control system of the digital camera of the first embodiment.

A digital camera 10 of this embodiment includes a casing 12, a lens unit 14 with a lens 13 provided at a front side thereof, and a shutter release button 16 at an upper surface of the casing 12 as shown in FIG. 1. A control system of the digital camera 10 is illustrated in a schematic block diagram in FIG. 2. The digital camera 10 includes a control section 20, a charge-coupled device (CCD) image sensor 52, a liquid crystal display (LCD) 24, a central processing unit (CPU) 26, a driver circuit 28, a media interface 30 (which provides external media 31 with access to the control system), an integral memory 32 and a communication interface 34. The driver circuit 28 is connected to the lens unit 14 to send signals for driving the lens unit 14. The control section 20, the CCD image sensor 52, the LCD 24, the CPU 26, the driver circuit 28, the media interface 30, the integral memory 32, the communication interface 34 and the shutter release button 16 are connected to each other via a bus 36.

Figure 3:
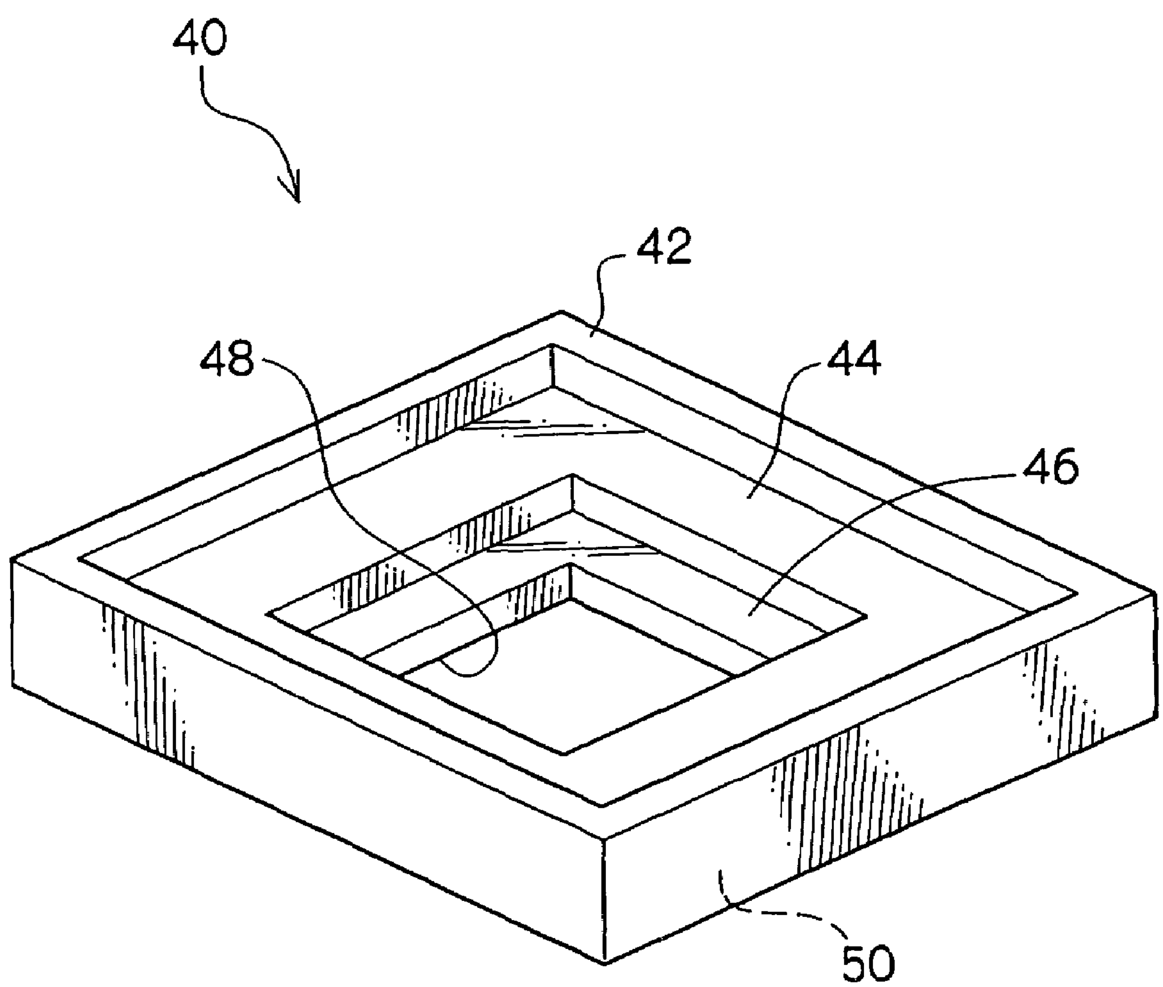
FIG. 3 is a perspective view of a multilayer wiring board of the first embodiment.

The digital camera 10 has a multilayer wiring board 40 provided therein. The multilayer wiring board 40 includes, on one side thereof, an outermost surface 42, a first surface 44 and a second surface 46, each having a rectangular frame shape as shown in FIG. 3. The outermost surface 42 forms the outermost surface of the multilayer wiring board 40 in the board thickness direction. The first surface 44 is formed inside the outermost surface 42, the height of the first surface 44 in a thickness direction of the multilayer wiring board 40 being smaller than that of the outermost surface 42. The second surface 46 is formed inside the first surface 44, the height of the second surface 46 in a thickness direction of the multilayer wiring board 40 being smaller than that of the first surface 44. In other words, the outermost surface 42, the first surface 44 and the second surface 46 are provided on one side of the multilayer wiring board 40 in a multilevel structure with steps provided between adjacent surfaces. The height of the step is greater than the thickness of the later-described CCD image sensor 52. A light-transmitting window 48 is formed at a central portion of the second surface 46. The other side of the multilayer wiring board 40, i.e., the side opposite to the side at which the outermost surface 42, the first surface 44 and the second surface 46 are provided, is formed as a back surface 50.

The step is provided at an inner side of the first surface 44, i.e., at an inner side of (an outer edge of) the first surface 44 in the surface direction thereof when seen as a plan view. In other words, the step structure is formed at an area extending from the outer edge of the first surface 44 to the light-transmitting window 48. This step structure makes it easy to overlappingly mount a later-described first circuit 54 and the CCD image sensor 52.

Figure 4:
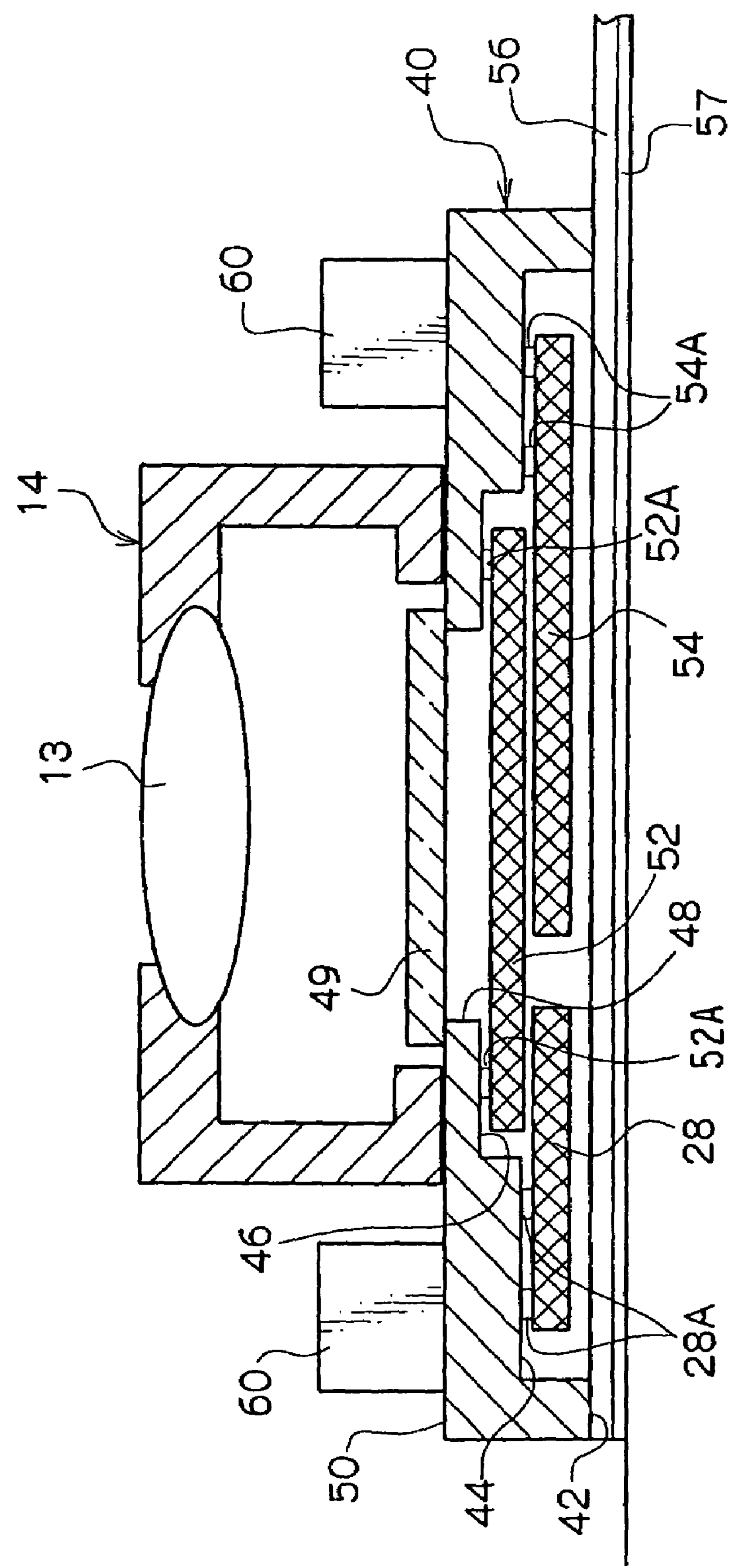
FIG. 4 is a cross-sectional view of the multilayer wiring board of the first embodiment with components mounted thereon.
Figure 5:
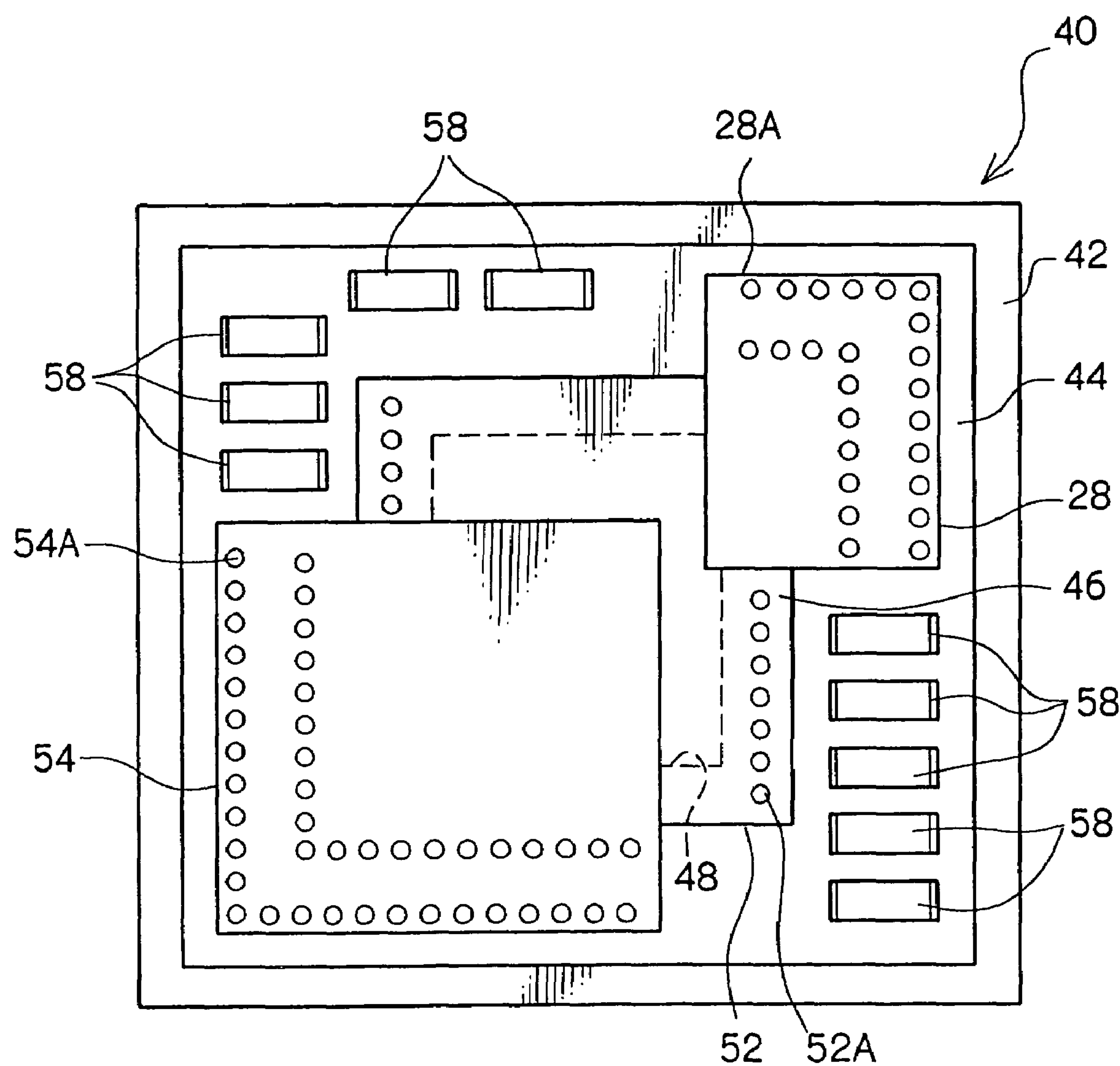
FIG. 5 is a diagram illustrating the multilayer wiring board of the first embodiment seen from an outermost surface side thereof.
Figure 6:
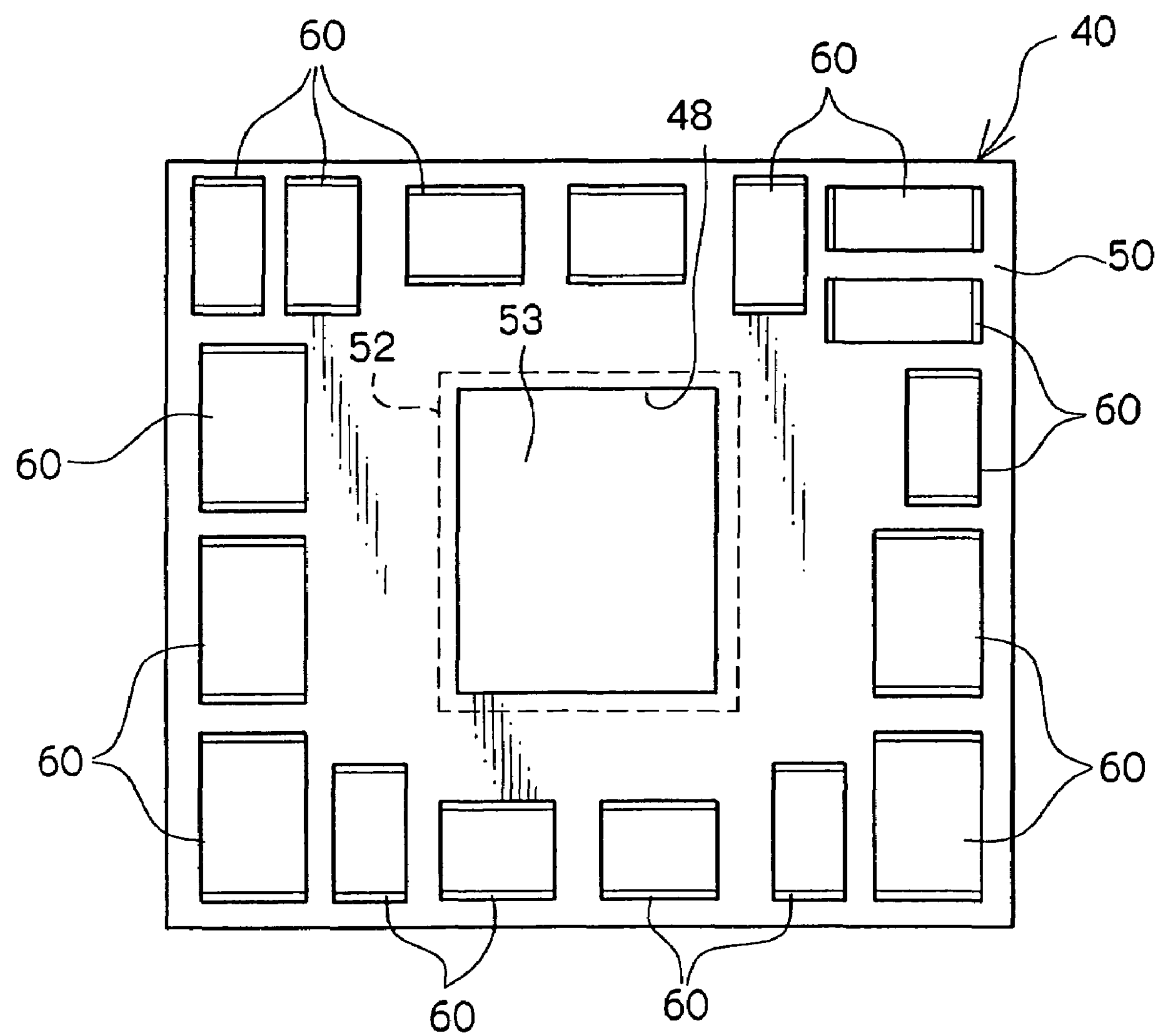
FIG. 6 is a diagram illustrating the multilayer wiring board of the first embodiment seen from a back surface side thereof.

On the multilayer wiring board 40 are mounted front surface components 58, including the CCD image sensor 52, the first circuit 54, a driver circuit 28, the lens unit 14, a flexible board 56, multiple resistors and capacitors and the like, and back surface components 60 including multiple resistors and capacitors and the like as shown in FIGS. 4, 5 and 6.

The CCD image sensor 52 is disposed on the second surface 46 and is electrically connected thereto by terminal(s) 52A. The CCD image sensor 52, which is sufficiently large to cover the light-transmitting window 48, is disposed to cover the light-transmitting window 48 with a light-receiving surface 53 facing the second surface 46 to receive the light coming in from the light-transmitting window 48.

The first circuit 54 is disposed at one corner of the first surface 44 and is electrically connected to the first surface 44 by terminal(s) 54A provided at one end portion of the first circuit 54. The first circuit 54 is disposed so as to overlap the CCD image sensor 52 in a non-contact manner at another end portion thereof. Since the first circuit 54 makes contact with the first surface 44 at one end portion thereof and overlaps the CCD image sensor 52 in a non-contact manner at another end portion thereof, it is easy to overlappingly mount the first circuit 54 and the CCD image sensor 52 on the first surface 44 and the second surface 46 in a non-contact manner.

The driver circuit 28 is disposed on the first surface 44 at the corner diagonally opposite the corner at which the first circuit 54 is disposed. The driver circuit 28 is electrically connected to the first surface 44 by terminal(s) 28A provided at one end portion of the driver circuit 28. The driver circuit 28 is disposed so as to overlap the CCD image sensor 52 in a non-contact manner at another end portion thereof.

The flexible board 56 is disposed on the outermost surface 42 so as to cover the first and second surfaces 44 and 46, and is electrically connected to the outermost surface 42 by terminal(s) (not shown) provided at one end portion of the flexible board 56. The other surface of the flexible board 56 is covered with an aluminum layer 57. Terminal(s) (not shown) of another end portion of the flexible board 56 are connected to other boards (not shown) and to the LCD.

The lens unit 14 is disposed on the back surface 50 at a position at which the lens unit faces the CCD image sensor 52 with the light-transmitting window interposed therebetween. The lens unit 14 is electrically connected to the back surface 50 by terminal(s) (not shown). The light passing through the lens unit 14 and the light-transmitting window 48 forms an image on the light-receiving surface 53 of the CCD image sensor 52. A light-transmitting cover glass 49 is provided over the light-transmitting window 48 at the lens unit 14 side thereof to cover the window 48.

The front surface components 58 are disposed on the first surface 44 at areas where neither the first circuit 54 nor the driver circuit 28 is disposed. The front surface components 58 are electrically connected to the first surface 44 by terminals (not shown). The back surface components 60 are disposed on the back surface 50 and are electrically connected thereto by terminals.

The multiple components may be overlappingly mounted on the multilayer wiring board 40 having the structure described above in an easy manner as shown in FIGS. 7A–7D.

Figure 7A:
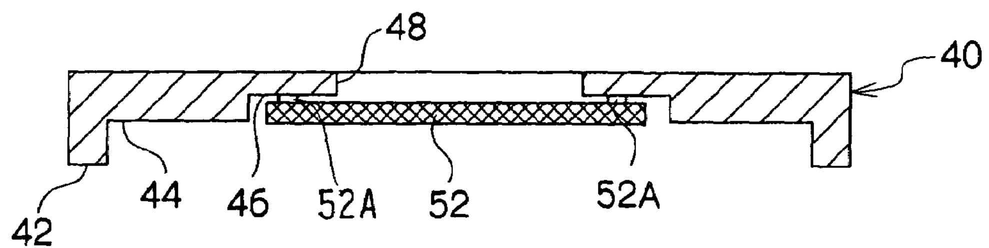
FIG. 7A illustrates a process of mounting components on the multilayer wiring board of the first embodiment.
Figure 7B:
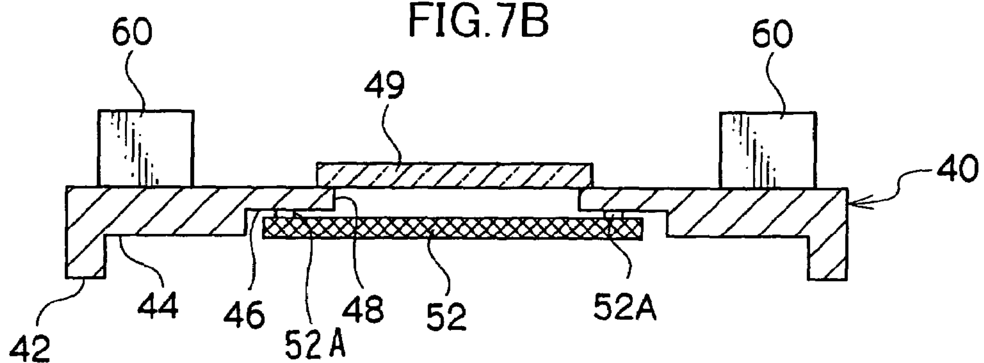
FIG. 7B illustrates the process of mounting the components on the multilayer wiring board of the first embodiment.
Figure 7C:
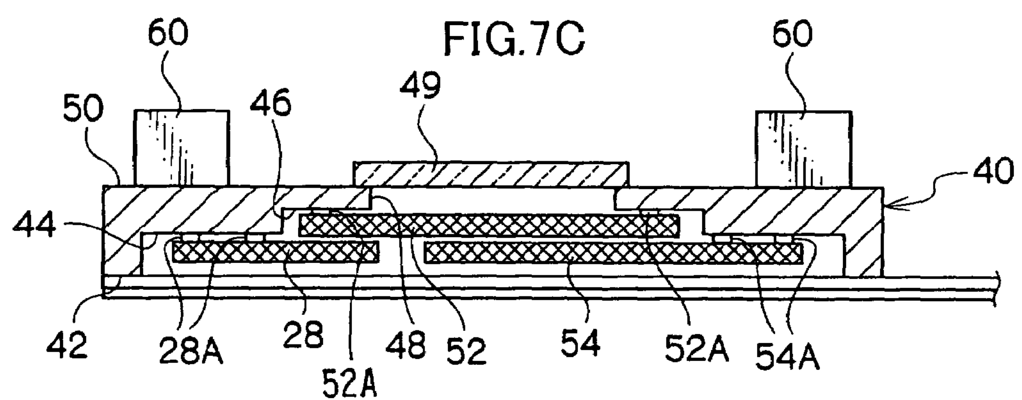
FIG. 7C illustrates the process of mounting the components on the multilayer wiring board of the first embodiment.
Figure 7D:
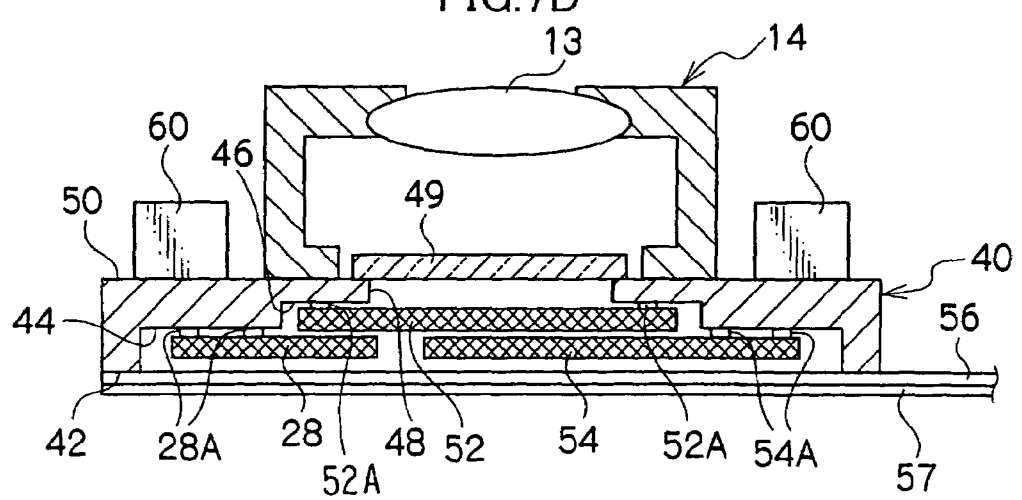
FIG. 7D illustrates the process of mounting the components on the multilayer wiring board of the first embodiment.

First, the CCD image sensor 52 is mounted on the second surface 46 of the multilayer wiring board 40 to cover the light-transmitting window 48 with the light-receiving surface of the CCD image sensor 52 facing the window 48 as shown in FIG. 7A. The back surface components 60 are then mounted on the back surface 50. The cover glass 49 is disposed on the back surface 50 to cover the light-transmitting window 48, shielding the light-receiving surface of the CCD image sensor 52 as shown in FIG. 7B. The first circuit 54 and the driver circuit 28 are then mounted on the first surface 44 as shown in FIG. 7C. The flexible board 56 is disposed on the outermost surface 42, and the outer side of the flexible board 56 is covered with the aluminum layer 57. The lens unit 14 is then mounted on the back surface 50 as shown in FIG. 7D.

In accordance with the foregoing structure, since the first surface 44 and the second surface 46 are different in height, the first circuit 54 and the driver circuit 28 may be partially disposed on the first surface 44 and, at the same time, partially overlap the CCD image sensor 52 in a non-contact manner. Thus, the terminals of the first circuit 54 and the driver circuit 28 may be electrically connected to the first surface 44 without requiring wires. Thus, there is no need for the terminals of the first circuit 54 and the driver circuit 28 to connect to the second surface 46, obviating influence of noise on wires which might otherwise be required.

In accordance with the foregoing structure, since the multiple components are overlappingly mounted on the multilayer wiring board 40, the wiring board can be reduced in size, compared to cases where multiple components are juxtaposed to one another.

In accordance with the foregoing structure, the CCD image sensor 52, the first circuit 54 and the driver circuit 28 are disposed within the multilayer wiring board 40 without protruding from the multilayer wiring board 40 in the thickness direction thereof. Thus, the total thickness of the multilayer wiring board 40 including components, such as the first circuit 54 and the driver circuit 28, mounted thereon can be reduced, compared to cases where the components are mounted on the outermost layer 42 of the multilayer wiring board 40.

In accordance with the foregoing structure, the light-transmitting window 48 is formed in the multilayer wiring board 40 and the CCD image sensor 52 is disposed on the multilayer wiring board 40 at the side opposite to the side at which light enters, with the light-transmitting window 48 interposed therebetween. Thus, the CCD image sensor 52 is disposed apart from the lens 13 by the amount of thickness of the second surface 46. Note that, in the digital camera 10, the distance between the lens 13 and the light-receiving surface 53 of the CCD image sensor 52 is determined depending on the size of the light-receiving surface 53. When the CCD image sensor 52 is thus disposed, the distance between the lens 13 and the CCD image sensor 52 can be accommodated by the thickness of the first surface 44. Accordingly, the total thickness of the multilayer wiring board 40 with the components including the lens unit 14 mounted thereon can be reduced compared to the case where the CCD image sensor 52 is disposed on the back surface 50 of the multilayer wiring board 40. With this structure, there is no need to form a resin portion of the lens unit 14 in a special configuration to reduce the distance between the lens 13 and the CCD image sensor 52, which allows general purpose lens units to be readily used.

In this embodiment, the outermost surface 42 is provided to absorb the thickness of the first circuit 54 and the driver circuit 28. Thus, the outermost surface 42 can readily be covered with the aluminum layer 57.

Figure 8:
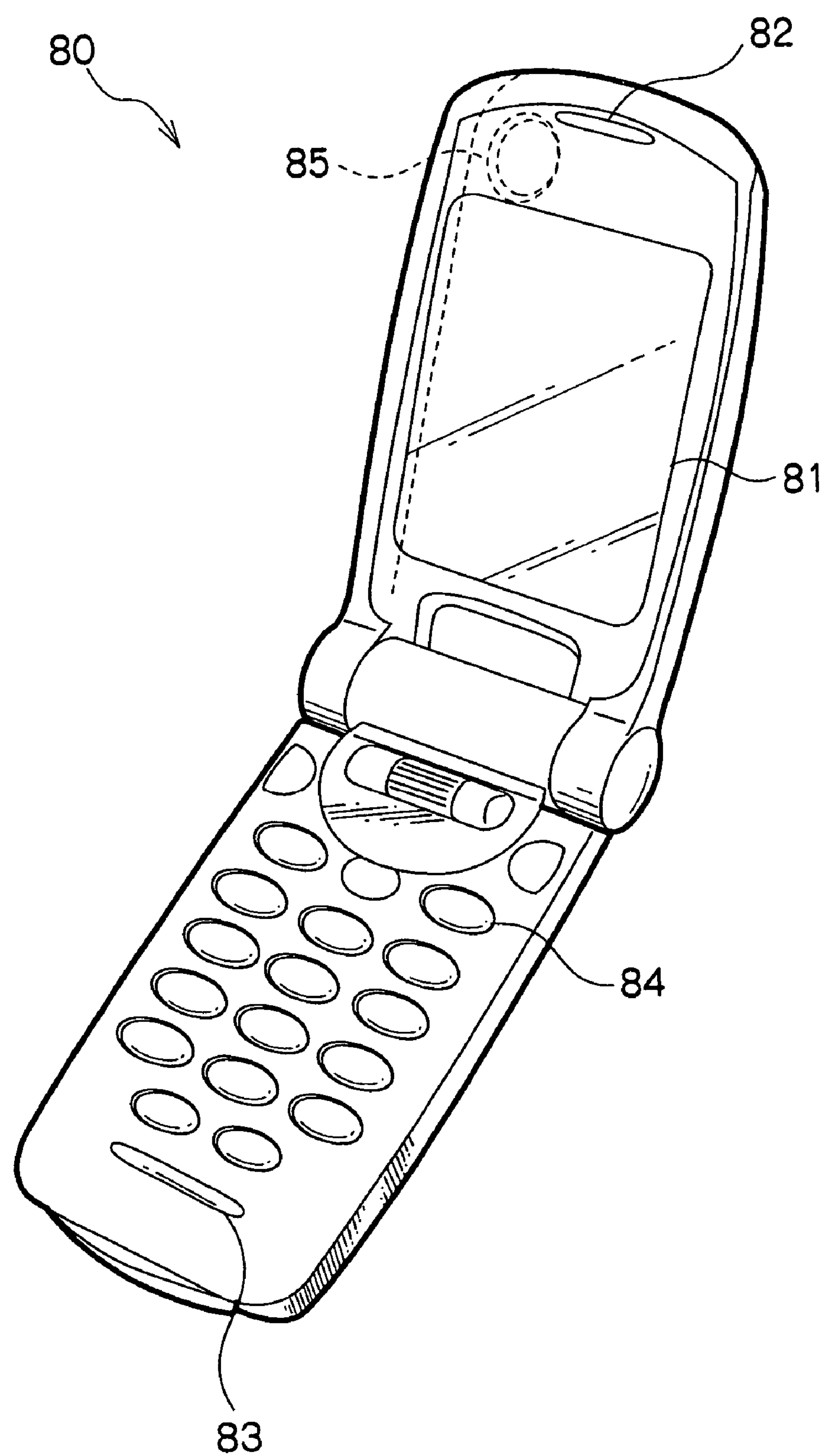
FIG. 8 shows an example of a cellular phone with a digital camera with the multilayer wiring board of the first embodiment applied thereto.

It should be noted that, while the digital camera 10 is illustrated in this embodiment, the image pick-up device of the present invention is not limited thereto, and the invention may also be applied to a digital video camera, a cellular phone with a digital camera, and the like. For example, the multilayer wiring board 40 of the present invention may be applied to a general cellular phone with a digital camera provided with a display 81, a speaker 82, a microphone 83, various control buttons 84, a camera 85, and the like as shown in FIG. 8.

Further, while the CCD image sensor 52 is illustrated in the present embodiment, the image sensor is not limited to the CCD image sensor. Other image sensors, including a CMOS image sensor, may also be used.

Though the multilayer wiring board 40 of this embodiment had three surfaces, namely, the outermost surface 42, the first surface 44 and the second surface 46, a two- or four-surface configuration may also be used.

Figure 11A:
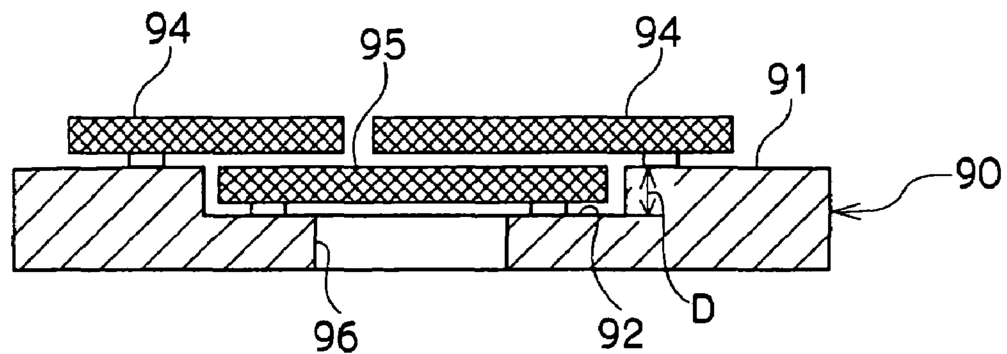
FIG. 11A is a side cross-sectional view showing an example of a multilayer wiring board of the invention.
Figure 11B:
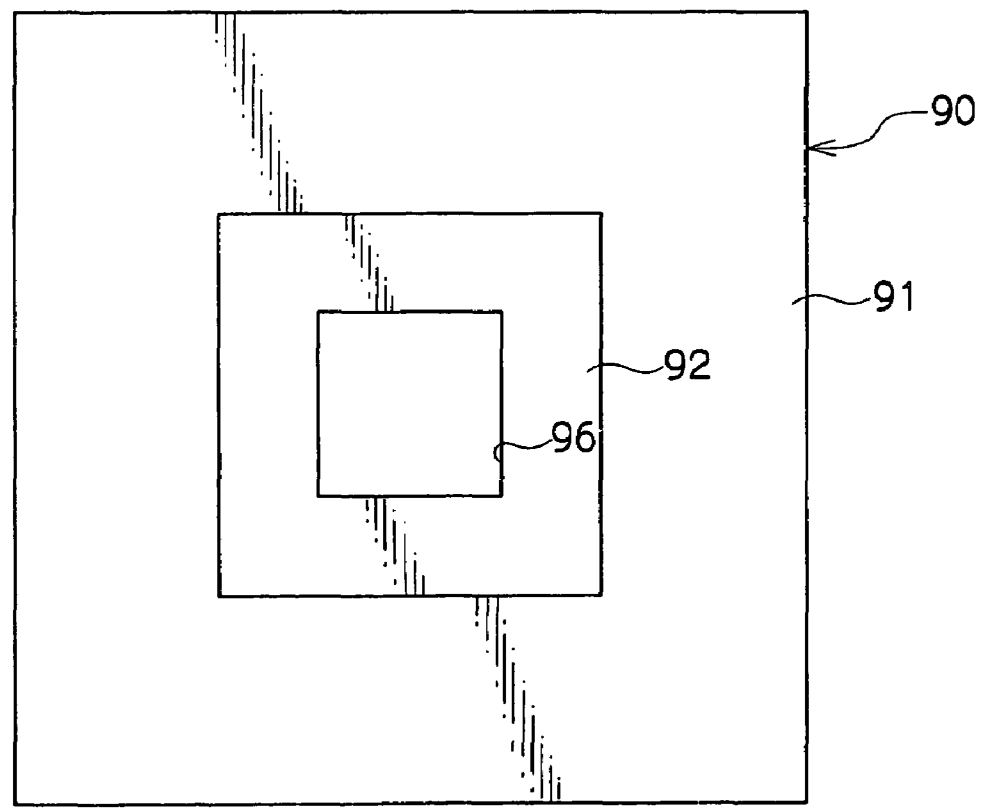
FIG. 11B is a top view showing the example of the multilayer wiring board of the invention.

For example, in a multilayer wiring board 90 having two surfaces, there is a difference D in height between a first surface 91 and a second surface 92 as shown in FIGS. 11A and 11B. With the difference D in height, a first component 94 and a second component 95 may be overlappingly mounted on the multilayer wiring board 90. Particularly, the second component 95 is mounted on the second surface 92 formed inside the step, and the first component 94 is mounted on the first surface 91 formed outside the step. The first component 94 is directly mounted on the first surface 91 in a non-contact manner with the second component 95, i.e., without being electrically connected to the second component 95 using wires and the like, obviating influence of noise on wires which might otherwise be required for mounting multiple components overlappingly on the multilayer wiring board. When a component which requires light-receiving, such as an image sensor, is mounted on the second surface 92, a light-transmitting window 96 formed in the second surface 92 allows light to reach a light-receiving surface of the component.

The multilayer wiring board of the present invention is preferably made from ceramic boards because of their high degree of freedom in shaping. A ceramic board may be die-cut to form recesses producing no debris from cut surfaces, while other materials, such as a glass epoxy boards, need cutting to form recesses, which often produces debris from cut surfaces.

The multilayer wiring board of the present invention may also be formed by multiple stacked unit boards, with the first and second surfaces being formed at surfaces of the stacked unit boards. The "unit board" herein refers to a board which itself may be used as a wiring board. With this stacked structure, the first and second surfaces may easily be formed using surfaces of the unit boards. Further, by altering the number of unit boards stacked, steps that absorb the thickness of the image sensor or the first component can easily be obtained.

(Second Embodiment)

Next, a second embodiment of the multilayer wiring board, the component mounting method and the image pick-up device of the present invention will be described. In this embodiment, components that are similar to those in the first embodiment will be denoted with the same reference numerals and detailed description thereof will be omitted.

As in the first embodiment, the multilayer wiring board of this embodiment may be applied to image pick-up devices such as a digital camera, a digital video camera and a cellular phone with a digital camera.

Figure 9:
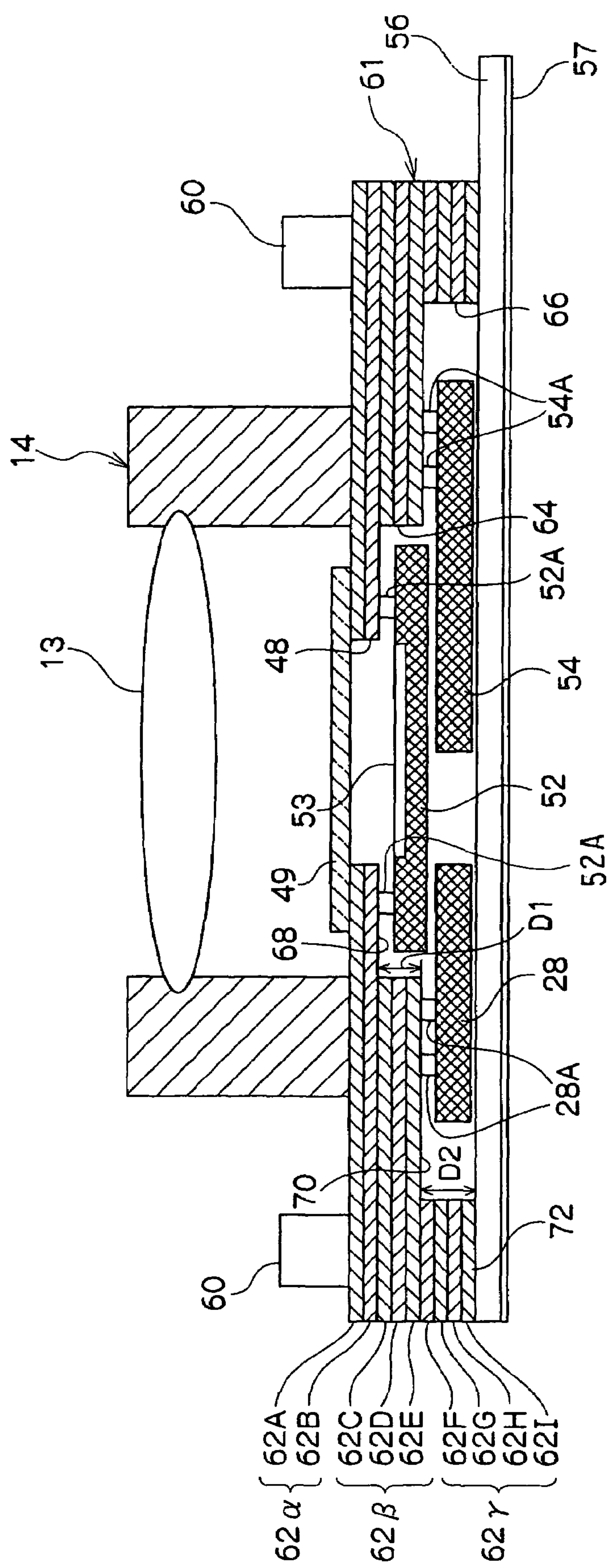
FIG. 9 is a cross-sectional view of a multilayer wiring board of a second embodiment with components mounted thereon.

The multilayer wiring board 61 of this embodiment is formed by nine layers stacked on each other, namely a first layer 62A to a ninth layer 62I from the top of the page in FIG. 9.

The first layer 62A and a second layer 62B are identical in dimensions and are hereinafter collectively referred to as a "first stage 62α." A light-transmitting window 48 is formed at the center of the first stage 62α. The surface of the first layer 62A opposite to the surface on which the second layer 62B is stacked is formed as a back surface 50.

A third layer 62C, a fourth layer 62D and a fifth layer 62E are identical in dimensions and are hereinafter collectively referred to as a "second stage 62β." A first opening 64 is formed at the center of the second stage 62β. The first opening 64 is larger than the light-transmitting window 48, and is provided at an outer side of the outer edge of the light-transmitting window 48. A step is provided between the first stage 62α and the second stage 62β, forming a step structure extending outwardly from the light-transmitting window 48 (the difference in height between the first stage 62α and the second stage 62β is referred to as a "difference D1"). The CCD image sensor 52 may be mounted on a first exposed surface 68 of the first stage 62α, which is formed at the second stage 62β side of the first stage 62α. The difference D1 is larger than the thickness of the CCD image sensor 52.

A sixth layer 62F, a seventh layer 62G, an eighth layer 62H and the ninth layer 62I are identical in dimensions and are hereinafter collectively referred to as a "third stage 62γ." A second opening 66 is formed at the center of the third stage 62γ. The second opening 66 is larger than the first opening 64, and is provided at an outer side of the outer edge of the first opening 64. A step is provided between the second stage 62β and the third stage 62γ, forming a step structure extending outwardly from the light-transmitting window 48 (the difference in height between the second stage 62β and the third stage 62γ is referred to as a "difference D2"). The first circuit 54 and the driver circuit 28 may be mounted on a second exposed surface 70 of the second stage 62β, which is formed at the third stage 62γ side of the second stage 62β. The difference D2 is larger than the thickness of the first circuit 54 and the driver circuit 28. A third exposed surface 72 is formed on the third stage 62γ at the side opposite to the second stage 62β side thereof.

The first exposed surface 68, the second exposed surface 70 and the third exposed surface 72 of the multilayer wiring board 61 having the structure described above respectively correspond to the second surface 46, the first surface 44 and the outermost surface 42 of the first embodiment. As in the first embodiment, the CCD image sensor 52 is mounted on the first exposed surface 68, the first circuit 54, the driver circuit 28 and the front surface components 58 are mounted on the second exposed surface 70, the flexible board 56 is mounted on the third exposed surface 72, and the lens unit 14 and the back surface components 60 are mounted on the back surface 50.

The multiple components may be overlappingly mounted on the multilayer wiring board 61 having the structure described above in an easy manner as shown in FIGS. 10A–10D.

Figure 10A:
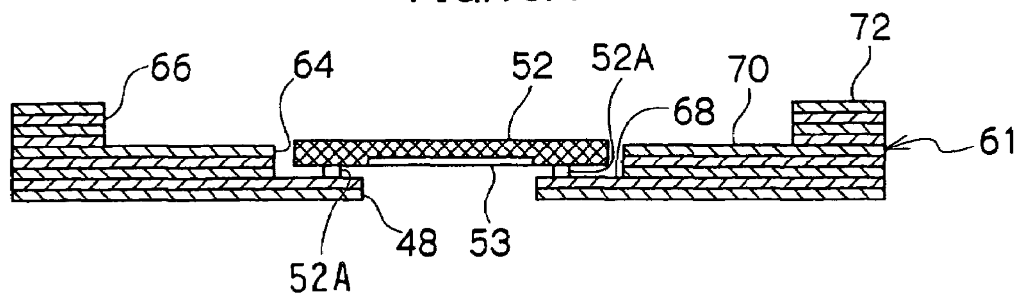
FIG. 10A illustrates a process of mounting components on the multilayer wiring board of the second embodiment.
Figure 10B:
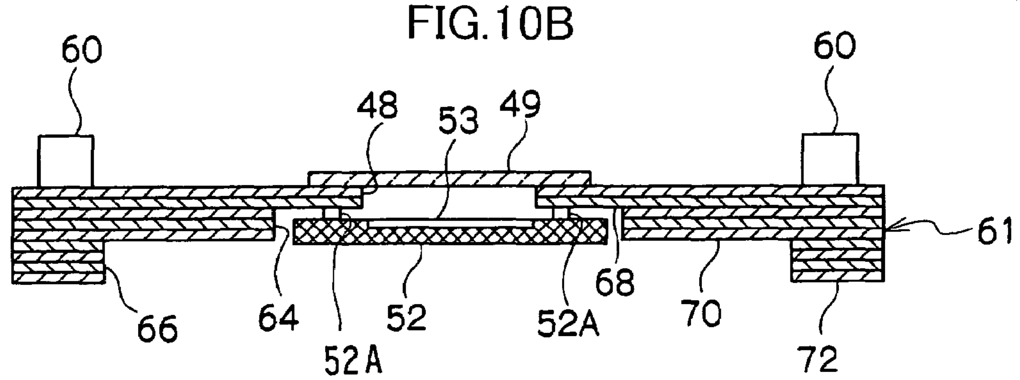
FIG. 10B illustrates the process of mounting the components on the multilayer wiring board of the second embodiment.
Figure 10C:
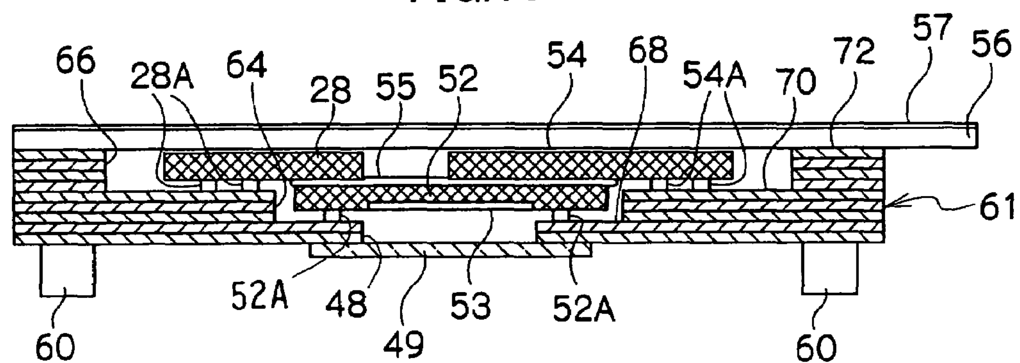
FIG. 10C illustrates the process of mounting the components on the multilayer wiring board of the second embodiment.
Figure 10D:
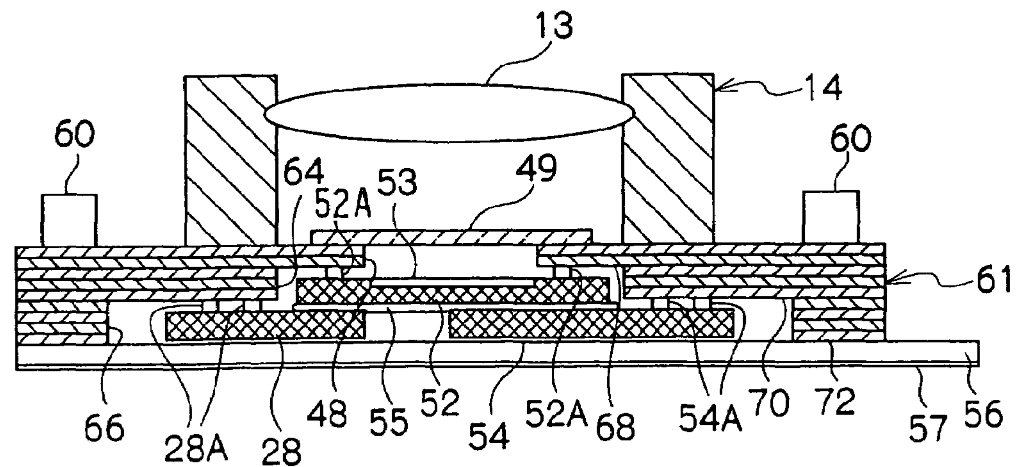
FIG. 10D illustrates the process of mounting the components on the multilayer wiring board of the second embodiment.

First, the CCD image sensor 52 is mounted on the first exposed surface 68 of the multilayer wiring board 61 to cover the light-transmitting window 48 with the light-receiving surface of the CCD image sensor 52 facing the window 48 as shown in FIG. 10A. The back surface components 60 are then mounted on the back surface 50. The cover glass 49 is disposed on the back surface 50 to cover the light-transmitting window 48, shielding the light-receiving surface of the CCD image sensor 52 as shown in FIG. 10B. The first circuit 54 and the driver circuit 28 are then mounted on the second exposed surface 70 as shown in FIG. 10C. Here, an under fill (i.e., an adhesive) 55 is applied onto areas where the first circuit 54 and the driver circuit 28 overlap the CCD image sensor 52 in order to enhance the fixation between the components. The flexible board 56 is disposed on the third exposed surface 72, and the outer side of the flexible board 56 is covered with the aluminum layer 57. The lens unit 14 is then mounted on the back surface 50 as shown in FIG. 10D.

In accordance with the multilayer wiring board 61 of this embodiment, the same effects as those of the first embodiment can be obtained. By altering the number of the layers stacked, the amount of the difference D1 or D2 may be easily altered, and thus the multilayer wiring board 61 corresponding to the components to be mounted may be produced easily.

What is claimed is:

1. A multilayer wiring board on which a plurality of components are overlappingly mounted, the multilayer wiring board comprising:

a first surface on which a first component among the multiple components is mounted; and a second surface whose height in a thickness direction of the multilayer wiring board is smaller than that of the first surface, by which a step is provided between the first surface and the second surface, a second component among the multiple components being mounted on the second surface to partially overlap the first component in a non-contact manner, the second surface also having a light-transmitting window through which light is transmitted.

2. The multilayer wiring board of claim 1, wherein the multilayer wiring board is formed by a plurality of stacked unit boards, and the first and second surfaces are formed at surfaces of the stacked unit boards.

3. The multilayer wiring board of claim 1, wherein the step is provided at an inner side of the first surface in a surface direction of the first surface.

4. The multilayer wiring board of claim 2, wherein the step is provided at an inner side of the first surface in a surface direction of the first surface.

5. The multilayer wiring board of claim 1, wherein a height of the step is greater than a thickness of the second component.

6. The multilayer wiring board of claim 2, wherein a height of the step is greater than a thickness of the second component.

7. The multilayer wiring board of claim 3, wherein a height of the step is greater than a thickness of the second component.

8. The multilayer wiring board of claim 4, wherein a height of the step is greater than a thickness of the second component.

9. A multilayer wiring board comprising:

a first stack with a light-transmitting window formed therein through which light is transmitted;

a second stack with an opening formed therein at a position at which light transmitted through the light-transmitting window can be transmitted through the opening, the second stack being disposed over the first stack, by which a step is provided between the first stack and the second stack;

and a component which is electrically connected to a surface of the second stack to at least partially cover the opening.

10. An image pick-up device including a multilayer wiring board on which a plurality of components are overlappingly mounted, the image pick-up device comprising:

a multilayer wiring board which includes a first surface on which at least one component among the multiple components is mounted and a second surface whose height in a thickness direction of the multilayer wiring board is smaller than that of the first surface, by which a step is provided between the first surface and the second surface, the second surface having a light-transmitting window through which light is transmitted;

an image sensor mounted on the second surface to receive light transmitted through the light-transmitting window;

a first component mounted on the first surface partially overlapping the image sensor in a non-contact manner; and a lens unit disposed at a position at which light from a subject transmitted through the light-transmitting window can be focused on a light-receiving surface of the image sensor.

11. The image pick-up device of claim 10, wherein the multilayer wiring board is formed by a plurality of stacked unit boards and the first and second surfaces are formed at surfaces of the stacked unit boards.

12. The image pick-up device of claim 10, wherein the first component makes contact with the first surface at one end portion thereof and overlaps the image sensor in a non-contact manner at another end portion thereof.

13. The image pick-up device of claim 11, wherein the first component makes contact with the first surface at one end portion thereof and overlaps the image sensor in a non-contact manner at another end portion thereof.

14. The image pick-up device of claim 10, wherein a height of the step is greater than a thickness of the image sensor.

15. The image pick-up device of claim 11, wherein a height of the step is greater than a thickness of the image sensor.

16. The image pick-up device of claim 12, wherein a height of the step is greater than a thickness of the image sensor.

17. The image pick-up device of claim 13, wherein a height of the step is greater than a thickness of the image sensor.

18. An image pick-up device comprising:

a multilayer wiring board which includes a first stack with a light-transmitting window formed therein through which light is transmitted, and a second stack with an opening formed therein at a position at which the opening at least partially overlaps the light-transmitting window, the second stack being disposed over the first stack, by which a step is provided between the first stack and the second stack, and a component which is electrically connected to a surface of the second stack to at least partially cover the opening;

an image sensor mounted on the first stack to receive light transmitted through the light-transmitting window and the opening; and a lens unit disposed at a position at which light from a subject transmitted through the light-transmitting window can be focused on a light-receiving surface of the image sensor.

19. A method of overlappingly mounting a plurality of components on a multilayer wiring board, the method comprising:

mounting an image sensor on a second surface of a multilayer wiring board to receive light coming in through the light-transmitting window, the multilayer wiring board including a first surface on which at least one component among the multiple components is mounted, and a second surface whose height in a thickness direction of the multilayer wiring board is smaller than that of the first surface, by which a step is provided between the first surface and the second surface, the second surface having a light-transmitting window through which light is transmitted; and mounting a first component on the first surface at a position at which the first component partially overlaps the image sensor in a non-contact manner.

20. The method of claim 19, wherein the first component is electrically connected to the first surface at one end portion thereof and overlaps the image sensor in a non-contact manner at another end portion thereof.

* * * * *